(12) United States Patent
Li et al.

(10) Patent No.: US 11,581,035 B2
(45) Date of Patent: Feb. 14, 2023

(54) SYSTEMS, DEVICES, AND METHODS FOR EFFICIENT USAGE OF IO SECTION BREAKS IN MEMORY DEVICES

(71) Applicant: Micron Technology, Inc., Boise, ID (US)

(72) Inventors: Jiyun Li, Boise, ID (US); Toby D. Robbs, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/184,345

(22) Filed: Feb. 24, 2021

(65) Prior Publication Data

US 2022/0270668 A1 Aug. 25, 2022

(51) Int. Cl.
*G11C 7/10* (2006.01)
*G11C 11/4097* (2006.01)
*G11C 11/4096* (2006.01)
*G11C 11/408* (2006.01)

(52) U.S. Cl.
CPC ...... *G11C 11/4097* (2013.01); *G11C 11/4085* (2013.01); *G11C 11/4096* (2013.01)

(58) Field of Classification Search
CPC ............ G11C 11/4094; G11C 11/4085; G11C 11/4097; G11C 7/02; G11C 11/4087
See application file for complete search history.

(56) References Cited

U.S. PATENT DOCUMENTS

| | | | | |
|---|---|---|---|---|
| 5,163,023 A * | 11/1992 | Ferris | ................... | G11C 29/848 365/230.02 |
| 5,559,749 A * | 9/1996 | McLaury | ............. | G11C 7/1075 365/230.02 |
| 11,017,879 B1 * | 5/2021 | Rehmeyer | .............. | G11C 29/78 |
| 2001/0019512 A1 * | 9/2001 | Hidaka | ............... | G11C 11/4096 365/230.03 |
| 2002/0109154 A1 * | 8/2002 | Lee | ....... | G11C 29/808 257/200 |
| 2017/0178697 A1 * | 6/2017 | Wu | ...... | G11C 11/4091 |
| 2021/0166776 A1 * | 6/2021 | Wieduwilt | ........... | G11C 29/789 |
| 2021/0241842 A1 * | 8/2021 | Amrie Bin Shaari | ...... | G11C 29/802 |
| 2022/0139444 A1 * | 5/2022 | He | ....... | G11C 29/028 365/230.06 |

* cited by examiner

*Primary Examiner* — Mushfique Siddique
(74) *Attorney, Agent, or Firm* — Fletcher Yoder, P.C.

(57) ABSTRACT

A memory device may include a memory array having a plurality of memory cells and a first column plane having multiple column select lines. The first column select lines of the first column plane may access a first set of the memory cells associated with the first column plane. Additionally, the memory device may include a second column plane having a multiple column select lines to access a second set of the memory cells associated with the second column plane. The memory device may also include a column select line shared between the first column plane and the second column plane. The column select line may access a third set of the memory cells associated with the first column plane and a fourth set of the memory cells associated with the second column plane.

21 Claims, 8 Drawing Sheets

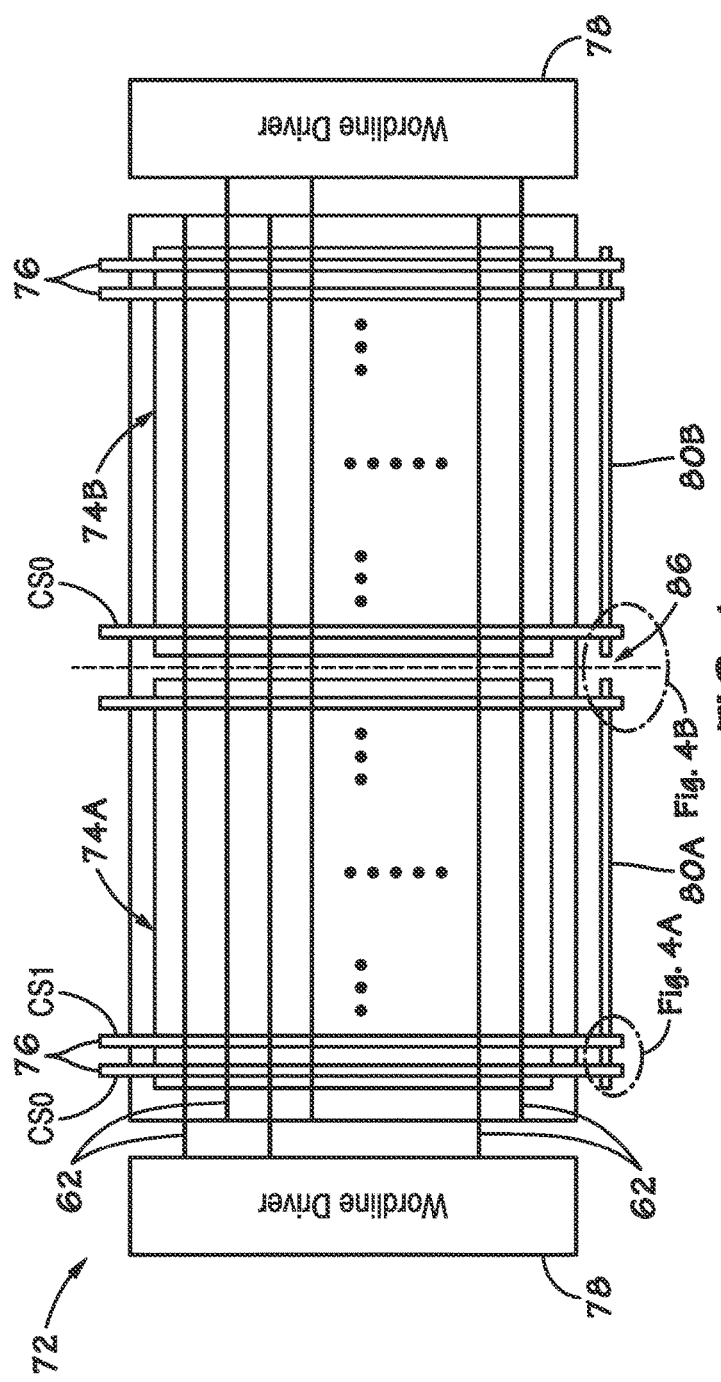
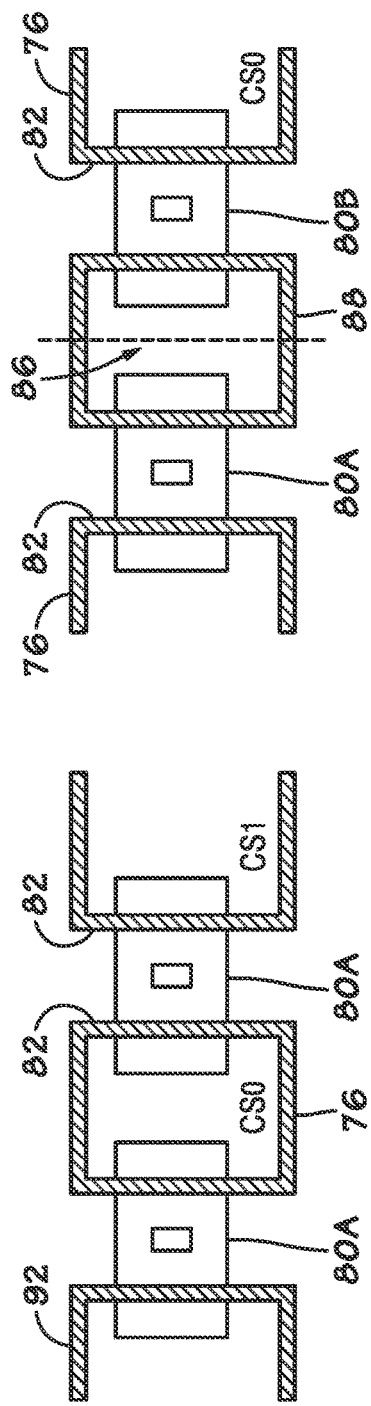

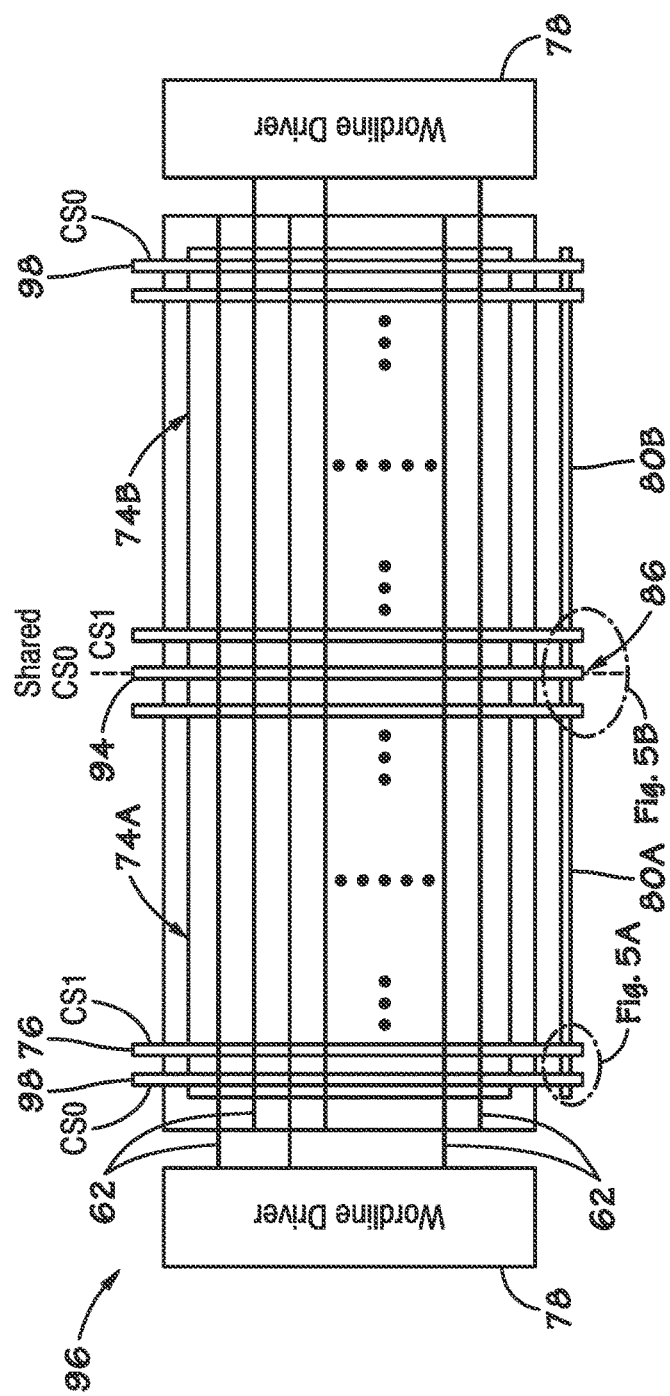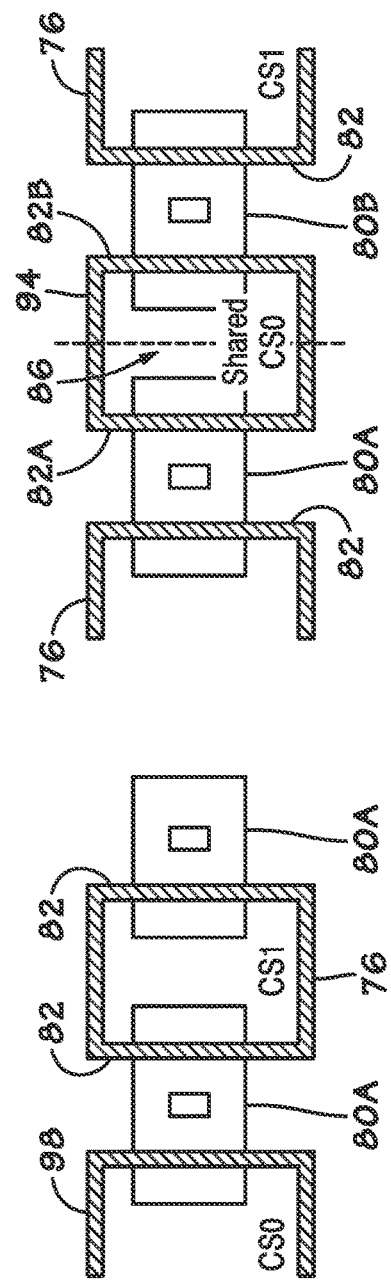

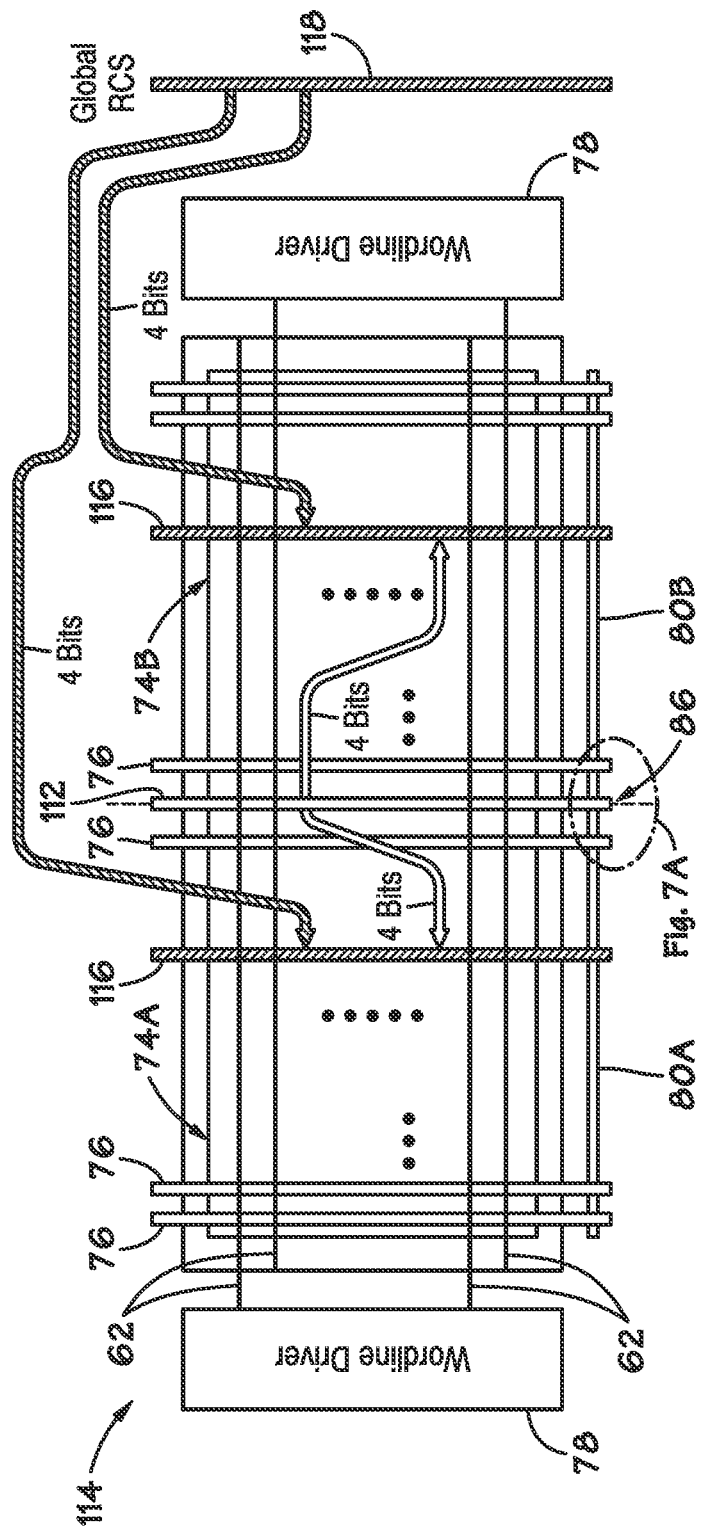
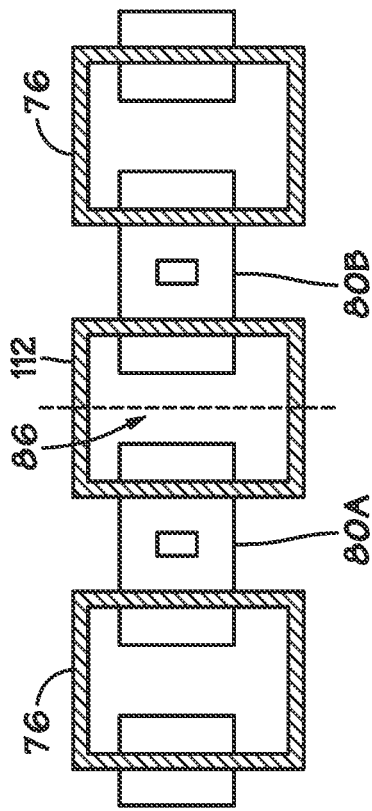

SYSTEMS, DEVICES, AND METHODS FOR EFFICIENT USAGE OF IO SECTION BREAKS IN MEMORY DEVICES

BACKGROUND

Embodiments described herein relate generally to the field of memory devices. More specifically, the current embodiments include one or more systems, devices, and methods that include efficient usage of input/output (IO) breaks between column select (CS) sections of a wordline of a memory device.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Various modes of operation in memory devices may lead to the accessing of memory cells on the memory device. During such operations, rows (e.g., wordlines) and columns (e.g., bitlines) of memory cells may be enabled to activate a particular memory cell or set of memory cells. In some scenarios, a single wordline may include multiple sections of input/output (IO) column select circuitry. Breaks between these IO sections may utilize unused circuitry (e.g., dummy circuitry), which may cause inefficiencies in manufacturing, function, and/or space on the memory device. Accordingly, embodiments described herein may be directed to one or more of the problems set forth above.

BRIEF DESCRIPTION OF DRAWINGS

FIG. 4 is a schematic diagram of a portion of the memory device including multiple column planes, in accordance with an embodiment of the present disclosure;

FIG. 4A is a zoomed view of a portion of the schematic diagram of FIG. 4, in accordance with an embodiment of the present disclosure;

FIG. 4B is a zoomed view of a portion of the schematic diagram of FIG. 4, in accordance with an embodiment of the present disclosure;

FIG. 5 is a schematic diagram of a portion of the memory device including multiple column planes and a shared column select line, in accordance with an embodiment of the present disclosure;

FIG. 5A is a zoomed view of a portion of the schematic diagram of FIG. 5, in accordance with an embodiment of the present disclosure;

FIG. 5B is a zoomed view of a portion of the schematic diagram of FIG. 5, in accordance with an embodiment of the present disclosure;

FIG. 7 is a schematic diagram of a portion of the memory device including multiple column planes and a shared redundant column select line, in accordance with an embodiment of the present disclosure;

FIG. 7A is a zoomed view of a portion of the schematic diagram of FIG. 7, in accordance with an embodiment of the present disclosure.

DETAILED DESCRIPTION

Figure 1:
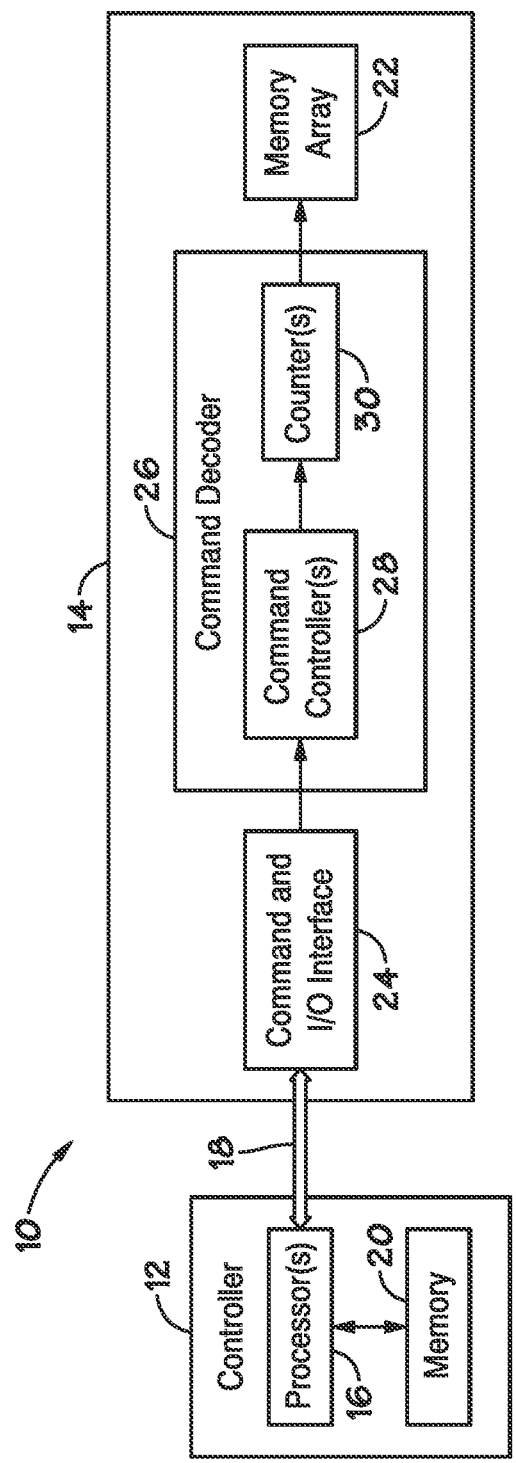
FIG. 1 is a block diagram illustrating a computer system, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

It may be desirable at multiple times to access the memory cells on a memory device. During such operations, sense amplifiers may sense the voltage of a memory cell and output a logical 1 or 0 corresponding to the sensed voltage. To read the memory cells, certain wordlines (e.g., rows) and bitlines (e.g., columns) may be enabled to access a particular memory cell or set of memory cells. In general, a wordline may be activated, and one or more columns may be selected to access one or more memory cells. In some scenarios, a single wordline may include multiple column planes. The column planes may include column select (CS) lines to access the memory cells of the memory array and associated input/output (IO) circuitry associated with each column plane to provide transportation of information to and from the memory array. In some embodiments, the IO circuitry may include breaks between column planes to isolate the transmission of information to the proper portions of the memory array. In some scenarios, dummy circuitry (e.g., a dummy column select line) may be utilized at breaks in the IO circuitry between the column planes.

In some embodiments, the efficiency of manufacturing, function, and/or space on the memory device may be improved by utilizing the column select line between the IO breaks instead of having a dummy circuit. For example, the column select line at an IO break between the column planes may be utilized as a shared column select line between a left column plane and a right column plane. As should be appreciated, although discussed herein as "left" and "right" for ease of discussion, the orientation of the column planes and/or other circuitry of the memory device may be of any suitable placement. The shared column select line may be used to access a portion of memory cells from each of the left and right column planes. Additionally or alternatively, the column select line along the IO break may be utilized as a shared redundant column select. In some embodiments, the shared redundant column select may improve repair capabilities, for example, if one or more column select lines become unusable. Moreover, the shared redundant column select may be utilized as part of a local redundant column select and/or as part of a global redundant column select.

Referring now to FIG. 1, a simplified block diagram of a computer system 10, which may provide for sequential access of a memory device, is illustrated. The computer system 10 includes a controller 12 and a memory device 14. The controller 12 may include processing circuitry, such as one or more processors 16 (e.g., one or more microprocessors), that may execute software programs to provide various signals to the memory device 14 over one or more bi-directional communication buses 18 to facilitate the transmission and receipt of data to be written to or read from the memory device 14. Moreover, the processor(s) 16 may include multiple microprocessors, one or more "general-purpose" microprocessors, one or more special-purpose microprocessors, and/or one or more application specific integrated circuits (ASICS), or some combination thereof. For example, the processor(s) 16 may include one or more reduced instruction set (RISC) processors.

The processor(s) 16 may be coupled to one or more memories 20 that may store information such as control logic and/or software, look up tables, configuration data, etc. In some embodiments, the processor(s) 16 and/or the memory 20 may be external to the controller 12. The memory 20 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 20 may store a variety of information and may be used for various purposes. For example, the memory 20 may store machine-readable and/or processor-executable instructions (e.g., firmware or software) for the processor(s) 16 to execute, such as instructions for providing various signals and commands to the memory device 14 to facilitate the transmission and receipt of data to be written to or read from the memory device 14.

The memory device 14 includes a memory array 22 of individual memory cells. As described further below, the memory array 22 may include one or more memory banks that may be grouped or partitioned in a variety of ways to provide access to the cells of the memory array 22, as described below. The controller 12 may communicate with the memory device 14 through one or more command and input/output (I/O) interfaces 24. In general, the command and input/output interfaces 24 provide access to various components of the memory device 14 by external devices, such as the controller 12.

The memory device 14 may include a command decoder 26. The command decoder 26 may receive command signals from the command and input/output (I/O) interfaces 24 and may decode the command signals to provide various internal commands. For instance, the command decoder 26 may decode commands, such as read commands, write commands, mode-register set commands, activate commands, etc., and provide access to specified regions of the memory array 22. Further, in order to generate internal addresses to be accessed, one or more counters 30 may also be provided. It should be noted that while the command controller 28 and counters 30 are illustrated as being part of the command decoder 26, alternatively, these elements may be provided elsewhere on the memory device 14.

Figure 2:
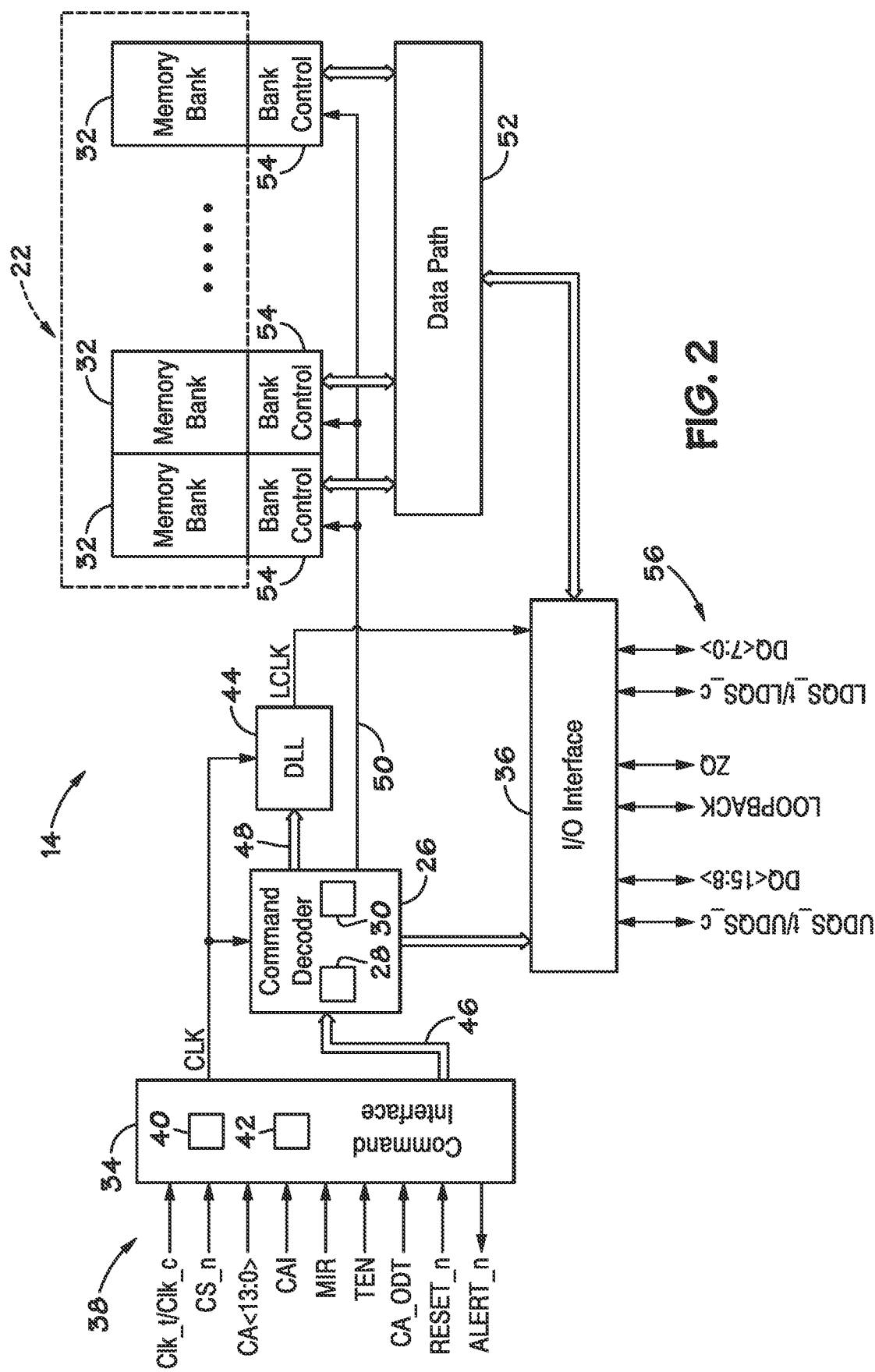
FIG. 2 is a block diagram illustrating an example memory device, in accordance with an embodiment of the present disclosure.

The block diagram of FIG. 2 is a functional block diagram illustrating certain additional features and related functionality of the memory device 14. In accordance with one embodiment, the memory device 14 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM. However, as will be appreciated, the embodiments discussed herein may be utilized with any suitable type of memory device 14.

The memory device 14, may include a memory array 22 logically and functionally grouped into a number of memory banks 32. The memory banks 32 may be DDR5 SDRAM memory banks, for instance. The memory banks 32 may be provided on one or more chips (e.g., SDRAM chips) that are arranged on dual inline memory modules (DIMMS). Each DIMM may include a number of SDRAM memory chips (e.g., x8 or x16 memory chips). Each SDRAM memory chip may include one or more memory banks 32. The memory device 14 represents a portion of a single memory chip (e.g., SDRAM chip) having a number of memory banks 32. For DDR5, the memory banks 32 may be further arranged to form bank groups. For instance, for an 8 gigabit (Gb) DDR5 SDRAM, the memory chip may include 16 memory banks 32, arranged into 8 bank groups, each bank group including 2 memory banks. For a 16 Gb DDR5 SDRAM, the memory chip may include 32 memory banks 32, arranged into 8 bank groups, each bank group including 4 memory banks, for instance. Various other configurations, organization and sizes of the memory banks 32 on the memory device 14 may be utilized depending on the application and design of the overall system.

The memory device 14 may also include a command interface 34 and an input/output (I/O) interface 36. The command interface 34 may provide a number of signals (e.g., signals 38) from an external device, such as a processor 16 or controller 12. The processor 16 or controller 12 may provide various signals 38 over one or more bi-directional data buses (e.g., data bus 18) to and from the memory device 14 to facilitate the transmission and receipt of data to be written to or read from the memory device 14.

As will be appreciated, the command interface 34 may include a number of circuits, such as a clock input circuit 40 and a command address input circuit 42, for instance, to ensure proper handling of the signals 38. The command interface 34 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 40 receives the true clock signal (Clk_t) and the complementary clock signal (Clk_c) and generates an internal clock signal CLK. The internal clock signal CLK is supplied to an internal clock generator 44, such as a delay locked loop (DLL) circuit. The internal clock generator 44 generates a phase controlled internal clock signal LCLK based on the received internal clock signal CLK. The phase controlled internal clock signal LCLK is supplied to the I/O interface 36, for instance, and is used as a timing signal for determining an output timing of read data.

The internal clock signal CLK may also be provided to various other components within the memory device 14 and may be used to generate various additional internal clock signals. For instance, the internal clock signal CLK may be provided to a command decoder 26. The command decoder 26 may receive command signals from the command bus 50 and may decode the command signals to provide various internal commands. For instance, the command decoder 26 may provide command signals to the internal clock generator 44 over the bus 48 to coordinate generation of the phase controlled internal clock signal LCLK. The phase controlled internal clock signal LCLK may be used to clock data through the I/O interface 36, for instance.

Further, the command decoder 26 may decode commands, such as read commands, write commands, activate commands, and mode-register set commands and provide access to a particular memory bank 32 corresponding to the command, via the bus path 52. As will be appreciated, the memory device 14 may include various other decoders, such as row decoders and column decoders, to facilitate access to the memory banks 32. In one embodiment, each memory bank 32 includes a bank control block 54 which provides the necessary decoding (e.g., row decoder and column decoder), as well as other features, such as timing control and data control, to facilitate the execution of commands to and from the memory banks 32.

The memory device 14 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 34 using the clock signals (Clk_t and Clk_c). The command interface 34 may include a command address input circuit 42 which is configured to receive and transmit the commands to provide access to the memory banks 32, through the command decoder 26, for instance. In addition, the command interface 34 may receive a chip select signal (CS_n). The CS_n signal enables the memory device 14 to process commands on the incoming CA<13:0> bus. Access to specific banks 32 within the memory device 14 is encoded on the CA<13:0> bus with the commands.

In addition, the command interface 34 may be configured to receive a number of other command signals. For instance, a command/address on die termination (CA_ODT) signal may be provided to facilitate proper impedance matching within the memory device 14. A reset command (RESET_n) may be used to reset the command interface 34, status registers, state machines and the like, during power-up for instance. The command interface 34 may also receive a command/address invert (CAI) signal which may be provided to invert the state of command/address signals CA<13:0> on the command/address bus, for instance, depending on the command/address routing for the particular memory device 14. A mirror (MIR) signal may also be provided to facilitate a mirror function. The MIR signal may be used to multiplex signals so that they can be swapped for enabling certain routing of signals to the memory device 14, based on the configuration of multiple memory devices in a particular application. Various signals to facilitate testing of the memory device 14, such as the test enable (TEN) signal, may be provided, as well. For instance, the TEN signal may be used to place the memory device 14 into a test mode for connectivity testing.

The command interface 34 may also be used to provide an alert signal (ALERT_n) to the system processor or controller for certain errors that may be detected. For instance, an alert signal (ALERT_n) may be transmitted from the memory device 14 if a cyclic redundancy check (CRC) error is detected. Other alert signals may also be generated. Further, the bus and pin for transmitting the alert signal (ALERT_n) from the memory device 14 may be used as an input pin during certain operations, such as the connectivity test mode executed using the TEN signal, as described above.

Data may be sent to and from the memory device 14, utilizing the command and clocking signals discussed above, by transmitting and receiving data signals 56 through the I/O interface 36. More specifically, the data may be sent to or retrieved from the memory banks 32 over the data path 52, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 14, certain memory devices, such as DDR memory devices may utilize data strobe signals, generally referred to as DQS signals. The DQS signals are driven by the external processor or controller sending the data (e.g., for a write command) or by the memory device 14 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 14, for instance.

An impedance (ZQ) calibration signal may also be provided to the memory device 14 through the I/O interface 36. The ZQ calibration signal may be provided to a reference pin and used to tune output drivers and ODT values by adjusting pull-up and pull-down resistors of the memory device 14 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 14 and GND/VSS external to the memory device 14. This resistor acts as a reference for adjusting internal ODT and drive strength of the IO pins.

In addition, a loopback signal (LOOPBACK) may be provided to the memory device 14 through the I/O interface 36. The loopback signal may be used during a test or debugging phase to set the memory device 14 into a mode wherein signals are looped back through the memory device 14 through the same pin. For instance, the loopback signal may be used to set the memory device 14 to test the data output (DQ) of the memory device 14. Loopback may include both a data and a strobe or possibly just a data pin. This is generally intended to be used to monitor the data captured by the memory device 14 at the I/O interface 36.

As will be appreciated, various other components such as power supply circuits (for receiving external VDD and VSS signals), mode registers (to define various modes of programmable operations and configurations), read/write amplifiers (e.g., sense amplifiers to amplify signals during read/write operations), temperature sensors (for sensing temperatures of the memory device 14), etc., may also be incorporated into the memory system 10. Accordingly, it should be understood that the block diagram of FIG. 2 is only provided to highlight certain functional features of the memory device 14 to aid in the subsequent detailed description, and is a non-limiting example of a memory device 14 utilizing the present embodiments.

Figure 3:
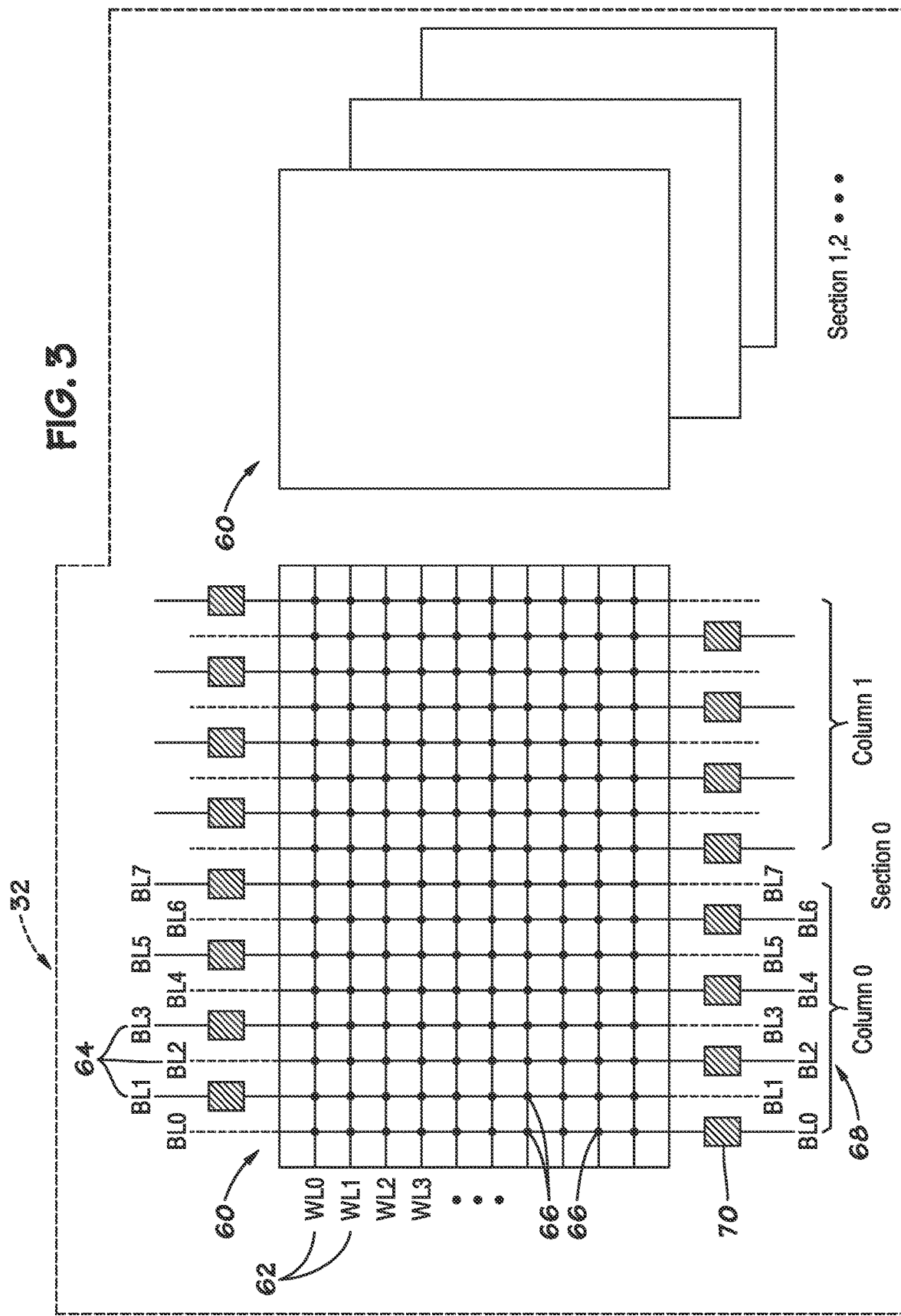
FIG. 3 is a schematic diagram of a portion of the memory device of FIG. 2, in accordance with an embodiment of the present disclosure.

In some embodiments, the memory banks 32 may be divided into one or more sections 60, as shown in FIG. 3. Each section 60 may include a grid of multiple wordlines 62, also known as rows, and bitlines 64, also known as digit lines. The intersection of a wordline 62 and a bitline 64 may then yield an individual memory cell 66 to store a single bit of data. Although logical data (e.g., 1s and 0s) are stored in each memory cell 66 defined by wordlines 62 and bitlines 64, to access the memory cells, each wordline 62 and bitline 64 may be assigned an address. Addresses within a section 60 may include a row address and a columns address. While a row address may include only one row/wordline 62, a column address may include multiple columns 68, which, in turn, may also include multiple bitlines 64. For example, a column 68 may include eight bitlines 64 (e.g., BL0-BL7), and a single column address may access sixteen columns 68. As such, 128 memory cells 66 (1×(8×16)) may be identified by the same row and column address. This may be referred to as 16n pre-fetch because sixteen columns 68 may be called upon by single column address. In some embodiments each column 68 may have more or fewer bitlines 64. For example, in one embodiment, each column includes one bitline 64. In such a case, columns 68 and bitlines 64 may be one and the same. Furthermore, in some embodiments, a single column address may access just one column. Therefore, each row and column address may be associated with a single memory cell 66. Although depicted in FIG. 3 with only ten wordlines 62 (e.g., WL0, WL1, etc.) and two columns 68, as will be appreciated, a section 60 may have any number of wordlines 62 and columns 68 depending on the application and design of the overall system.

On each bitline 64, a sense amplifier 70 may be used to determine the logical state of a memory cell 66. For example, when a bitline 64 is activated, along with a corresponding wordline 62, the logical state of a memory cell 66 may be read by the sense amplifier 70. The sense amplifier 70 may then compare the read value to a reference value, amplify the difference between the two, and output the determined value of the memory cell 66. As such, the sense amplifier 70 may draw power from a power supply to amplify and hold the read value. Additionally, as illustrated, the sense amplifiers 70 for each bitline 64 may be located physically on alternating sides of the section 60. However, in other embodiments, the sense amplifiers 70 may be located on the same side of the section 60 or elsewhere depending on the application and design of the memory device 14.

To access the memory cells 66, a row address and column address may be used to activate the corresponding wordline(s) 62 and bitline(s) 64. To help illustrate, FIG. 4 is a schematic diagram of a portion 72 (e.g., a section 60) of the memory device 14 including multiple column planes 74 (e.g., a left column plane 74A and right column plane 74B), each having multiple column select lines 76. As should be appreciated, directional references such as "left," "right," "top", and "bottom," etc. are used for ease of discussion, and the orientation of the column planes and/or other circuitry of the memory device may be of any suitable placement. Furthermore, in general, a wordline 62 may be associated with any number of column planes 74 (e.g., one, two, four, or more). The column select lines 76 may provide access to one or more memory cells 66 associated with the column address. Additionally, wordline drivers 78 may be used to provide access to the memory cells 66 associated with the wordline(s) 62 of the row address. In conjunction with one another, the column select lines 76 and the wordline drivers 78 may provide access to specific memory cells 66.

As should be appreciated, the length of a wordline 62 may be of any suitable length, and the number of column select lines 76, column planes 74 associated with a wordline 62, and/or the number of bits per column select line 76 may vary based on implementation. By way of example, in some embodiments, a section 60 may include two column planes 74, each having sixty-four column select lines 76. Moreover, in some embodiments, a wordline 62 may include one kilobit of information spread across one-hundred and twenty-eight column select lines 76, each associated with eight bits of information.

Additionally, each column plane 74 may include associated input/output (IO) circuitry 80 (e.g., left IO circuitry 80A and right IO circuitry 80B). The IO circuitry may provide transportation of information to and/or from the column planes 74, for example, during reading or writing. To access a memory cell 66, the column select line 76 of a column plane 74 (e.g., left column plane 74A) includes a column select gate 82, as illustrated in the zoomed view of FIG. 4A, to connect the memory cell 66 to the associated 10 circuitry 80 (e.g., left 10 circuitry 80A). As should be appreciated, each column select line 76, when activated with a wordline 62, may be associated with multiple memory cells 66. Moreover, although the 10 circuitry 80 is shown on one side of the column planes 74, in some embodiments, the column select lines 76 may route the bits of information from the memory cells 66 through column select gates 82 of IO circuitry 80 on both the top and bottom of the column plane 74. For example, if a column select line 76 is activated to access eight bits (e.g., associated with eight memory cells 66), four bits may be routed through IO circuitry 80 on top of the column plane 74 and four bits may be routed through IO circuitry 80 on bottom of the column plane 74.

In some scenarios, a single wordline 62 may span multiple column planes 74. As such, the IO circuitry 80 may include breaks 86 between column planes to isolate the transmission of information to the proper portions of the memory array 22. For example, in some embodiments, column select lines 76 from different column planes 74 (e.g., left column plane 74A and right column plane 74B) may be activated simultaneously such that the column planes 74 operate in parallel. Moreover, the parallel activation of column select lines 76 in multiple column planes 74 may increase the amount of data stored per memory address. For example, although a wordline 62 may be associated with one-hundred and twenty-eight column select lines 76, there may be sixty-four column select commands associated with the wordline 62. Each memory address may correspond to a column select line 76 in each of the column planes 74, and each column select line 76 may activate simultaneously with a corresponding column select line 76 in the other column plane 74 to achieve the parallel activation. For example, each column plane 74 may have a column select zero (CS0), a column select one (CS1), and so on. The IO break 86 may provide separation between the left IO circuitry 80A and the right IO circuitry 80B to allow for the parallel operation without crossover/mixing of the data.

In some scenarios, dummy circuitry 88 (e.g., a dummy column select line) may be utilized at a break 86 in the IO circuitry 80 between the column planes 74, as illustrated in the zoomed view of FIG. 4B. The dummy circuitry 88 may assist in keeping the memory array 22 uniform throughout the column planes 74. Additionally or alternatively, the edges of the column planes 74 may also utilize edge dummy circuitry 92, which may be a partial column select line 76. However, the dummy circuitry 88 and/or edge dummy circuitry 92 may take up valuable space on the memory device and/or deplete resources in manufacturing unnecessarily. As stated above, a wordline 62 may be associated with one or more column planes 74. As such, the amount of dummy circuitry 88, edge dummy circuitry 92, and/or IO breaks 86 may depend on how many column planes 74 and associated IO circuitry are implemented per wordline 62.

In some embodiments, the efficiency of manufacturing, function, and/or space on the memory device may be improved by making use of dummy circuitry 88 such as the column select line 76 at the IO break 86, instead of leaving such dummy circuitry 88 or edge dummy circuitry 92 unused. For example, the column select line 76 at an IO break 86 between the column planes 74 may be utilized as a shared column select line 94 between a left column plane 74A and a right column plane 74B, as shown in the portion 96 of the memory device 14 of FIG. 5.

The shared column select line 94 may be used to access a portion of the memory cells 66 from each of the left column plane 74A and right column plane 74B. For example, if a column select line 76 is associated with eight bits of information (e.g., from eight memory cells 66), four bits of information may be accessed via the shared column select line 94 for each column plane 74, as the column select gates 82 (e.g., left gate 82A and right gate 82B) are split among the 10 circuitry 80 (e.g., left IO circuitry 80A and right 10 circuitry 80B) of each column plane 74, as illustrated in the zoomed view of FIG. 5B. The shared column select line 76 may provide additional access to memory cells 66 in the same footprint as the dummy circuitry 88.

Additionally or alternatively, the edge dummy circuitry 92 may be repurposed and utilized to provide access to memory cells 66. For example, a partial column select line 98 may be used to access half of the data of a full column select line 76, as illustrated in the zoomed view of FIG. 5A. Furthermore, when used in conjunction with one another, the shared column select line 94 and the partial column select lines 98 (e.g., from the CS0 of the left column plane 74A and from the CS0 of the right column plane 74B) may provide access to a full and individual set of memory cells 66 for each column plane 74. As should be appreciated, although discussed herein as pertaining to CS0, it should be appreciated that the shared column select line 94 and/or partial column select lines 98 may be associated with any particular column select. Furthermore, as the associated column select lines 76 (e.g., CS0) from each column plane 74 activate in parallel, the shared column select line 94 may also activate in parallel with the corresponding partial column select lines 98. Moreover, the utilization of the partial column select line 98 and/or the shared column select line 94 may allow for additional memory cells 66 to be accessed (e.g., additional column select lines 76) in the same footprint as with dummy circuitry 88 installed or for the overall footprint to be reduced.

Figure 6:
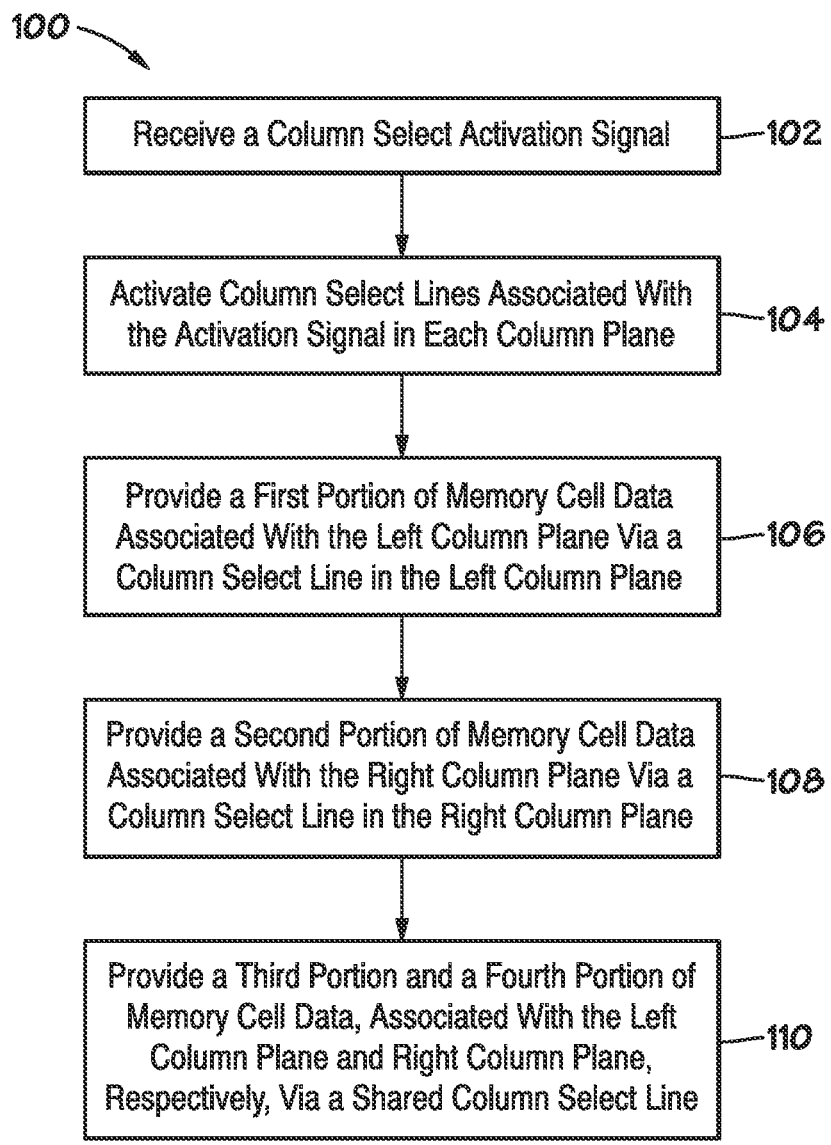
FIG. 6 is a flowchart of an example method for utilizing a shared column select line, in accordance with an embodiment of the present disclosure.

FIG. 6 is a flowchart 100 of an example method for utilizing a shared column select line 94. The column planes 74 may receive a column select activation signal (process block 102), for example, indicative of a memory address. The column select lines 76 associated with the activation signal may be activated in each column plane 74 (process block 104). The memory device 14 may provide a first portion of memory cell data associated with the left column plane 74A via a column select line 76 in the left column plane 74A (process block 106). For example, the memory cell data may be accessed via a partial column select line 98. Additionally, the memory device 14 may provide a second portion of memory cell data associated with the right column plane 74B via a column select line 76 in the right column plane 74B (process block 108) (e.g., the memory cell data may be accessed via a partial column select line 98). Furthermore, a third portion and a fourth portion of memory cell data, associated with the left column plane 74A and right column plane 74B, respectively, may be provided via a shared column select line 94 (process block 110).

In some embodiments, the memory device 14 may include a redundant column select scheme (e.g., a local redundant column select scheme or a global redundant column select scheme) to replace one or more column select lines 76 in response to a failure within the circuitry. For example, one or more memory cells 66, column select gates 82, or transmission lines (e.g., command lines and/or IO circuitry 80) may experience a fault, either over time or due to a manufacturing defect. However, the redundant column select scheme may replace non-functional column select lines 76 with local or global redundant column select lines. In some embodiments, a local redundant column select line may be disposed in or adjacent to a column plane 74, and may replace a column select line 76 in that column plane 74. Additionally or alternatively, a global redundant column select line may be disposed separate from the column planes 74 and may be utilized to replace a column select line 76 for one of many different column planes 74. In some embodiments, if a shared column select line 94 is replaced with a global redundant column select line, the memory device 14 may include data steering circuitry to emulate the shared column select line 94 connecting to both the left IO circuitry 80A and the right IO circuitry 80B.

As stated above, the efficiency of manufacturing, function, and/or space on the memory device may be improved by making use of dummy circuitry 88, for example, as a shared column select line 94. Additionally or alternatively, the column select line 76 between the column planes 74 may be utilized as a shared redundant column select line 112, as illustrated in the example portion 114 of a memory device 14 of FIG. 7. In general, when a failed column select line 116 is detected, a local redundant column select line (not shown) may be used in its stead. However, if no local redundant column select line is available to replace the failed column select line 116, a global redundant column select line 118 may be used to supplant the failed column select line 116. Furthermore, in some scenarios, the global redundant column select scheme may not be able to replace failed column select lines 116 if both failed column select lines 116 are of the same address (e.g., corresponding column select lines 76 in separate column planes 74). For example, a global redundant column select line 118 may be able to replace eight bits of data at a time, but when both corresponding column select lines 76 of a left column plane 74A and a right column plane 74B are failed column select lines 116, the failure corresponds to sixteen bits of data, in the depicted example. However, a shared redundant column select line 112 may be utilized to provide four bits of data to each of the left column plane 74A and a right column plane 74B, as illustrated in the zoomed view of FIG. 7A. Similar to the shared column select line 94, the shared redundant column select line 112 may have column select gates 82 associated with both left 10 circuitry 80A and right 10 circuitry 80B. In conjunction with a global redundant column select line 118, the shared redundant column select line 112 may provide increased redundancy and/or provide remedies to single or double failed column select lines 116.

Additionally or alternatively, the shared redundant column select line 112 may also be used with partial column select lines 98 to form two quasi-local redundant column select lines. For example, a partial column select line 98 in the left column plane 74A, a partial column select line 98 in a right column plane 74B, and a shared redundant column select line 112 may provide the equivalent of two column select lines 76, each with eight bits of data. By utilizing the column select line 76 along the 10 break 86 as a shared redundant column select line 112, the memory device 14 may exhibit increased redundancy, which may lead to increased usable die in manufacturing and/or better longevity.

Figure 8:
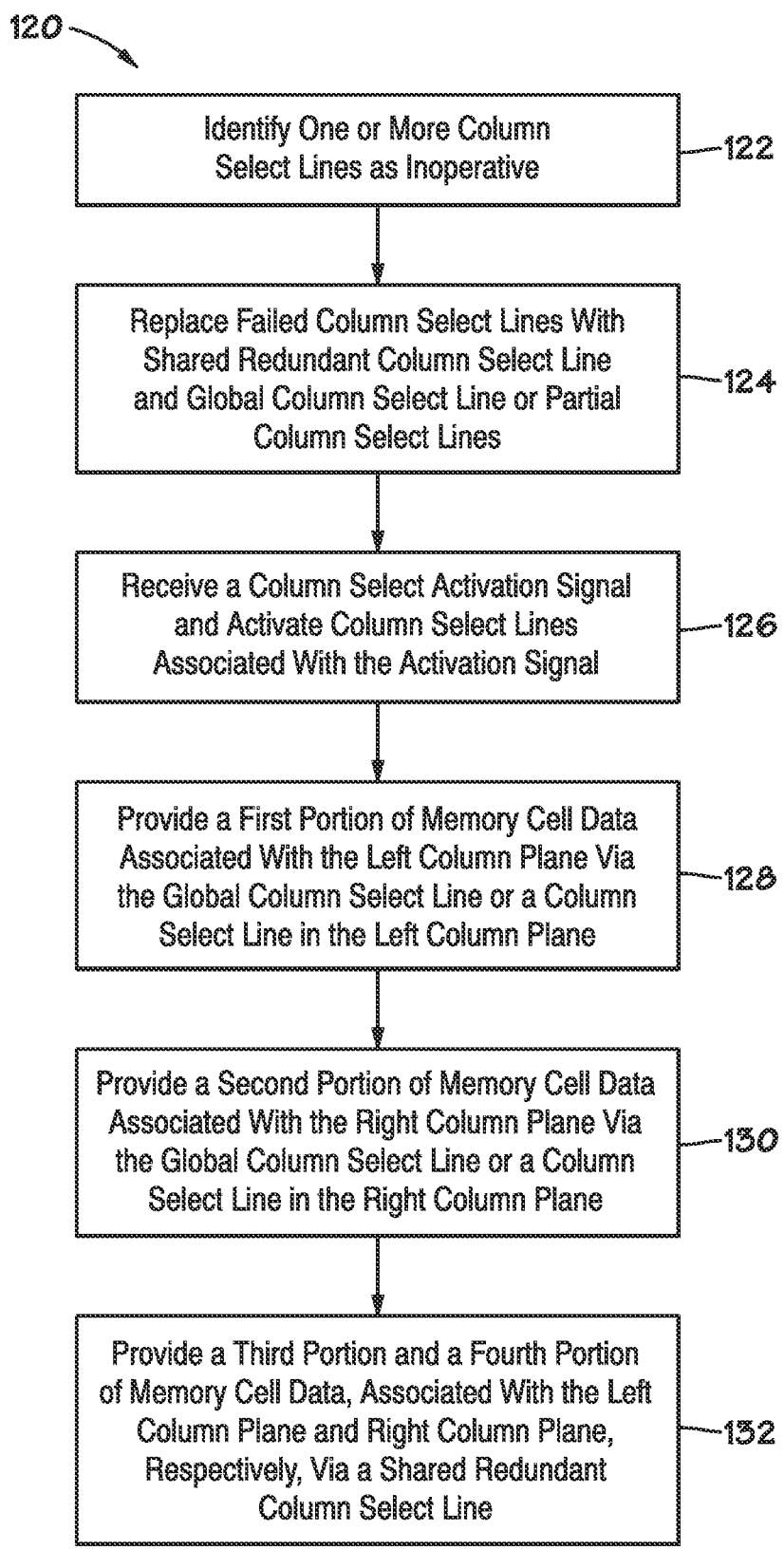
FIG. 8 is a flowchart of an example method for utilizing a shared redundant column select line, in accordance with an embodiment of the present disclosure.

FIG. 8 is a flowchart 120 of an example method for utilizing a shared redundant column select line 112. In some embodiments, one or more column select lines 76 may be identified as being inoperative (process block 122). For example, the failed column select lines 116 may be identified during manufacturing, during testing, and/or may be dynamically identified during the life of the memory device 14. The failed column select lines 116 may be replaced with shared redundant column select lines 112 and a global column select line 118 or partial column select line 98 (process block 124). The column planes 74 may receive a column select activation signal, for example, indicative of a memory address, and the column select lines 76 (e.g., the shared redundant column select line 112) associated with the activation signal may be activated (process block 126). The memory device 14 may provide a first portion of memory cell data associated with the left column plane 74A via the global column select line 118 or a column select line 76 in the left column plane (process block 128). For example, the memory cell data may be accessed via a partial column select line 98. Additionally, the memory device 14 may provide a second portion of memory cell data associated with the right column plane 74B via the global column select line 118 or a column select line 76 in the right column plane 74B (process block 130) (e.g., the memory cell data may be accessed via a partial column select line 98). Furthermore, the memory device may provide a third portion and a fourth portion of memory cell data, associated with the left column plane 74A and right column plane 74B, respectively, via a shared redundant column select line 112 (process block 132).

As discussed herein, a shared column select line 94 and/or a shared redundant column select line 112 may be utilized in a memory device 14 in place of dummy circuitry 88 to increase efficiencies in manufacturing, space on the memory device 14, and/or function, as well as increased redundancy and repair capabilities. Moreover, the shared column select line 94 and/or shared redundant column select line may save space on the memory device 14 by utilizing space otherwise allotted to dummy circuitry 88 and/or edge dummy circuitry 92. As should be appreciated, although the above flowcharts 100, 120 are depicted in a particular order, in certain embodiments, steps may be reordered, altered, deleted, repeated, and/or occur simultaneously.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
a memory array comprising a plurality of memory cells;
a first column plane comprising a first plurality of column select lines, wherein the first plurality of column select lines are configured to access a first set of the plurality of memory cells associated with the first column plane;
a second column plane comprising a second plurality of column select lines, wherein the second plurality of column select lines are configured to access a second set of the plurality of memory cells associated with the second column plane;
a column select line shared between the first column plane and the second column plane, wherein the column select line is configured to access a third set of the plurality of memory cells associated with the first column plane and a fourth set of the plurality of memory cells associated with the second column plane,
first input/output (TO) circuitry configured to communicate first memory data with the first column plane; and
second IO circuitry configured to communicate second memory data with the second column plane, wherein the column select line is disposed at an IO break between the first IO circuitry and the second IO circuitry.

2. The memory device of claim 1, wherein the column select line is configured to communicate third data with the first IO circuitry and communicate fourth data with the second IO circuitry.

3. The memory device of claim 2, wherein the column select line comprises:
a first column select gate configured to control communication with the first TO circuitry; and
a second column select gate configured to control communication with the second TO circuitry.

4. The memory device of claim 1, comprising a partial column select line configured to access a fifth set of the plurality of memory cells, wherein a combination of the third set of the plurality of memory cells and the fifth set of the plurality of memory cells comprise all of the memory cells corresponding to the first column plane and associated with a specific column address.

5. The memory device of claim 1, wherein the column select line comprises a shared redundant column select line configured to replace, at least partially, one of the first plurality of column select lines, one of the second plurality of column select lines, or a combination thereof.

6. The memory device of claim 5, comprising one or more global redundant column select lines configured to, in conjunction with the shared redundant column select line, replace the one of the first plurality of column select lines, the one of the second plurality of column select lines, or the combination thereof.

7. The memory device of claim 1, wherein the column select line is disposed between the first column plane and the second column plane and parallel with the first plurality of column select lines and the second plurality of column select lines.

8. The memory device of claim 1, wherein the memory device comprises a double data rate type five synchronous dynamic random access memory (DDR5 SDRAM).

9. A system comprising:
a controller; and
a double data rate type five synchronous dynamic random access memory (DDR5 SDRAM) device communicatively coupled to the controller, wherein the DDR5 SDRAM memory device comprises:
a first column plane comprising a first plurality of memory cells;
a second column plane comprising a second plurality of memory cells; and
a shared column select line configured to access a first subset of the first plurality of memory cells and a second subset of the second plurality of memory cells.

10. The system of claim 9, wherein the first column plane is communicatively coupled to first input/output (TO) circuitry and the second column plane is communicatively coupled to second TO circuitry, wherein the first TO circuitry and the second TO circuitry are separated by an TO break.

11. The system of claim 10, wherein the shared column select line is coupled to the first TO circuitry and the second TO circuitry at the TO break.

12. The system of claim 9, wherein:
the first column plane comprises a first plurality of column select lines;
the second column plane comprises a second plurality of column select lines; and
each column select line of the first plurality of column select lines is activated in parallel with a corresponding column select line of the second plurality of column select lines.

13. The system of claim 12, wherein:
the first plurality of column select lines comprises a first partial column select line;
the second plurality of column select lines comprises a second partial column select line; and
the shared column select line is configured to activate in parallel with the first partial column select line and the second partial column select line.

14. The system of claim 9, comprising a wordline driver configured to control activation of wordlines, wherein a single wordline spans both the first column plane and the second column plane.

15. The system of claim 9, comprising one or more global redundant column select lines configured to, in conjunction with the shared column select line, replace a first column select line of the first column plane and a second column select line of the second column plane.

16. A method, comprising:
receiving, at one or more column select lines, a column select activation signal associated with a memory address;
in response to the column select activation signal, activating one or more column select lines associated with the memory address;
providing a first portion of memory cell data associated with a first column plane via a first column select line of the first column plane;
providing a second portion of memory cell data associated with a second column plane via a second column select line of the second column plane;
providing a third portion of memory cell data associated with the first column plane via a shared column select line; and
providing a fourth portion of memory cell data associated with the second column plane via the shared column select line, wherein the shared column select line is disposed between the first column plane and the second column plane and parallel with the first column select line and the second column select line.

17. The method of claim 16, comprising:
identifying a third column select line of the first column plane as inoperable; and
replacing, at least in part, the third column select line with the shared column select line.

18. The method of claim 17, comprising replacing, at least in part, the third column select line with a redundant column select line.

19. The method of claim 16, comprising reading the first portion of the memory data and the third portion of the memory data via first input/output (TO) circuitry.

20. The method of claim 19, comprising reading the second portion of the memory data and the fourth portion of the memory data via second IO circuitry, wherein the first IO circuitry and the second IO circuitry are communicatively separated by an IO break.

21. The method of claim 19, wherein communication between the first column plane and the first IO circuitry is controlled by a column select gate.

* * * * *